United States Patent
Stewart et al.

(10) Patent No.: US 7,115,817 B2
(45) Date of Patent: Oct. 3, 2006

(54) HEAT SINK AND ELECTROMAGNETIC INTERFERENCE REDUCTION DEVICE

(75) Inventors: Thomas E. Stewart, Saratoga, CA (US); Steven J. Furuta, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 305 days.

(21) Appl. No.: 10/247,182

(22) Filed: Sep. 18, 2002

(65) Prior Publication Data

US 2004/0052027 A1    Mar. 18, 2004

(51) Int. Cl.
*H05K 1/00*    (2006.01)

(52) U.S. Cl. .................. 174/252; 174/260; 174/261; 361/816; 361/818

(58) Field of Classification Search ........... 174/252, 174/52.1, 51; 361/709–711, 717–722, 816, 361/818
See application file for complete search history.

(56) References Cited

U.S. PATENT DOCUMENTS

| | | | |
|---|---|---|---|
| 5,166,772 A | | 11/1992 | Soldner et al. |
| 5,357,404 A | * | 10/1994 | Bright et al. ............... 361/818 |
| 5,369,601 A | * | 11/1994 | Tannenbaum ............... 702/139 |
| 5,371,404 A | | 12/1994 | Juskey et al. |
| 5,524,908 A | | 6/1996 | Reis |
| 5,561,265 A | | 10/1996 | Livshits et al. |
| 5,566,052 A | | 10/1996 | Hughes |
| 5,586,005 A | * | 12/1996 | Cipolla et al. .............. 361/719 |
| 5,639,989 A | | 6/1997 | Higgins, III |
| 5,748,455 A | | 5/1998 | Phillips et al. |
| 5,804,875 A | * | 9/1998 | Remsburg et al. .......... 257/718 |
| 5,825,634 A | | 10/1998 | Moorehead, Jr. |
| 5,866,943 A | | 2/1999 | Mertol |
| 5,880,524 A | | 3/1999 | Xie |
| 5,880,930 A | | 3/1999 | Wheaton |
| 5,932,925 A | | 8/1999 | McIntyre |
| 5,960,863 A | * | 10/1999 | Hua ........................... 165/80.3 |
| 6,037,659 A | * | 3/2000 | Weixel ....................... 257/717 |
| 6,057,600 A | | 5/2000 | Kitazawa et al. |
| 6,075,289 A | | 6/2000 | Distefano |
| 6,084,178 A | | 7/2000 | Cromwell |
| 6,088,231 A | | 7/2000 | Fajardo |
| 6,137,051 A | | 10/2000 | Bundza |

(Continued)

OTHER PUBLICATIONS

"Identifying an EMI Source and Coupling Path in a Computer System with Sub-Module Testing"; Radu, et al. Electromagnetic Compatibility Laboratory, Department of Electrical Engineering, University of Missouri-Rolla, Rolla, MO & Electromagnetic Compatibility Group, Sun Microsystems, Mountain View, CA; p. 165-170; Jun. 1997.

(Continued)

*Primary Examiner*—Kamand Cuneo
*Assistant Examiner*—Jeremy C Norris
(74) *Attorney, Agent, or Firm*—Meyertons Hood Kivlin Kowert & Goetzel, P.C.; B. Noël Kivlin (57) ABSTRACT

An electrical assembly comprising a circuit board an electrical device, and a heat dissipation device. The electrical device is capable of emitting thermal energy and electromagnetic interference (EMI). The electrical device is secured to the circuit board. The heat dissipation device is secured to the circuit board and is in thermal communication with the electrical device. The heat dissipation device also includes a continuous EMI fence and a plurality of fins disposed in a matrix orientation. The fins are spaced from one another to allow for efficient heat dissipation and have a substantially square cross-sectional shape.

17 Claims, 5 Drawing Sheets

U.S. PATENT DOCUMENTS

| | | |
|---|---|---|
| 6,140,577 A | 10/2000 | Rapaich et al. |
| 6,198,630 B1 | 3/2001 | Cromwell |
| 6,212,074 B1 | 4/2001 | Gonsalves et al. |
| 6,219,239 B1 | 4/2001 | Mellberg et al. |
| 6,239,359 B1 | 5/2001 | Lilienthal, II et al. |
| 6,252,313 B1 | 6/2001 | Zhang et al. |
| 6,259,609 B1 | 7/2001 | Kurz |
| 6,269,863 B1 | 8/2001 | Wyler |
| 6,278,617 B1 | 8/2001 | Yang et al. |
| 6,288,330 B1 | 9/2001 | Chen |
| 6,288,344 B1 | 9/2001 | Youker et al. |
| 6,324,074 B1 | 11/2001 | Lunden |
| 6,362,477 B1 | 3/2002 | Sowerby et al. |
| 6,362,977 B1 | 3/2002 | Tucker et al. |
| 6,377,474 B1 | 4/2002 | Archambeault et al. |
| 6,400,577 B1 | 6/2002 | Goodwin et al. |
| 6,404,632 B1 | 6/2002 | Forkas |
| 6,444,900 B1 | 9/2002 | Casey |
| 6,452,113 B1 | 9/2002 | Dibene, II et al. |
| 6,515,861 B1 | 2/2003 | Andric et al. |
| 6,524,120 B1 | 2/2003 | Zhao |
| 6,543,521 B1 * | 4/2003 | Sato et al. ............... 165/80.3 |
| 6,573,590 B1 | 6/2003 | Radu et al. |
| 6,577,504 B1 | 6/2003 | Lofland et al. |
| 6,606,246 B1 | 8/2003 | Wells |
| 6,611,431 B1 | 8/2003 | Lee et al. |
| 6,654,256 B1 | 11/2003 | Gough |
| 6,683,796 B1 | 1/2004 | Radu et al. |
| 6,775,140 B1 | 8/2004 | Shim et al. |
| 6,819,553 B1 | 11/2004 | Willis et al. |
| 6,819,572 B1 | 11/2004 | Schaffer |
| 6,856,796 B1 | 2/2005 | Ding et al. |
| 2002/0166681 A1 | 11/2002 | Muzurkiewicz |
| 2003/0007334 A1 | 1/2003 | Farassat |
| 2003/0111738 A1 | 6/2003 | Buschbom |
| 2003/0227759 A1 | 12/2003 | Haworth |
| 2004/0012939 A1 | 1/2004 | Ta et al. |

OTHER PUBLICATIONS

"Radio Frequency Interference Seal"; IBM Technical Disclosure Bulletin, vol. 33, No. 5, IBM Corp., Armonk NY, Oct. 1990.

"Mechanical Enabling Efforts"; Intel Developer Forum, Sep. 2000.

"Intel Pentium 4 Processor in the 423-pin package EMI Guideline"; Oct. 2000.

"T-putty 502 Series"; Thermagon, Inc.; Spec. Sheet; A13520-00 Rev. A EO#3126; Jan. 24, 2002.

U.S. Appl. No. 10/097,946, Filed Mar. 14, 2002.

Otthello Heatsink, Sun Part No. 340-6655-07, Copyright 2001.

EMI fence for Othello heatsink, Sun Part No. 340-7201-03, Copyright 2001 (1 page).

Sputnik CPU board heatsink, Sun Part No. 340-7334-01, Copyright 2001 (3 pages).

U.S. Appl. No. 10/757,735.

* cited by examiner

HEAT SINK AND ELECTROMAGNETIC INTERFERENCE REDUCTION DEVICE

BACKGROUND OF THE INVENTION

1. Field of the Invention

The present invention relates to an electrical assembly having heat dissipation and electromagnetic interference reduction features.

2. Description of Related Art

Electrical devices, and central processing units in particular, draw high power and produce more heat than can be convected away from the dies of the device. If the die temperature exceeds acceptable levels, the device will either cease functioning, not operate at acceptable levels, and/or function in an unreliable manner. In addition, many electrical devices emit electromagnetic interference (EMI) that can adversely affect nearby electronics or electronic communication. The Federal Communication Commission of the U.S. government and industry agencies, such as Telcordia and United Laboratories, have established and verified EMI limits for such electrical devices.

To address this problem, heat dissipation devices are used to convect heat away from electrical devices. Many heat dissipation devices also incorporate EMI reduction features to ensure that government EMI limitations are complied with.

Heat dissipation devices of the prior art have several deficiencies. For example, prior art heat dissipation devices that use a matrix of fins incorporate fins that have inefficient dimensions and that are inefficiently spaced for heat conduction and heat convection purposes. Moreover, many heat dissipation devices incorporate an inefficient cross sectional fin shape, such as an undesirable rectangular shape, that only permits satisfactory heat dissipation when positioned in a first orthogonal orientation. Thus, these heat dissipation devices cannot adequately dissipate heat when positioned in a second orthogonal orientation. This prevents such heat dissipation devices from being used in systems that require the heat dissipation devices to be positioned in a second orthogonal orientation. Moreover, heat dissipation devices of the prior art incorporate heat interface material to allow for thermal communication between the heat dissipation device and the electrical device. The thermal interface material used, however, is expensive.

Heat dissipation devices of the prior art that incorporate EMI reduction features incorporate a compliant member between the EMI reduction feature and the object to which the EMI reduction feature is grounded, such as a circuit board. The compliant member provides better contact between the EMI reduction feature and the circuit board, and thus provides adequate grounding, which is required for acceptable EMI reduction. The complaint member, however, adds extra costs.

Therefore, it would be desirable to provide an electrical assembly that includes heat dissipation and EMI reduction features that is not susceptible to one or more of the shortcomings of prior art devices.

SUMMARY OF THE INVENTION

The present invention relates to an electrical assembly having heat dissipation and EMI reduction features. The electrical assembly includes a heat dissipation device, an electrical device that is capable of emitting heat and EMI, and a circuit board. A first embodiment of the electrical assembly of the invention includes a first embodiment of a heat dissipation device of the invention. The first embodiment of the heat dissipation device has a plurality of fins disposed in matrix orientation that are efficiently spaced from one another and has fins that have a cross sectional shape that is symmetric about two orthogonal axes. The efficient spacing improves heat convection, and the symmetrical cross sectional shape allows for efficient convection in two orthogonal directions. Further, the first embodiment includes a solder ring instead of a compliant member for grounding. The heat dissipation device includes an EMI fence that has connector receiving portions that are offset from a bottom surface of the fence to ensure contact between a bottom surface of the EMI fence and the solder ring. This improves grounding between the heat dissipation device and the circuit board.

The first embodiment of the heat dissipation device includes top and bottom surfaces. A continuous EMI fence depends from the bottom surface, and a plurality of fins disposed in a matrix orientation extend from the top surface. The EMI fence surrounds the electrical device and is grounded to the circuit board. The fins are spaced from one another to allow for efficient heat dissipation and have a substantially square cross-sectional shape. In another embodiment of the heat dissipation device, a body portion of the fins have a substantially uniform cross sectional area, and a base that has a greater cross sectional area than the body portion.

In another embodiment of the electrical assembly, the electrical device is disposed in thermal communication with the heat dissipation device by way of a thermal interface pad, instead of a phase change thermal interface material.

A more complete understanding of the electrical assembly and heat dissipation device of the invention will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention pertains to an electrical assembly 2 that includes a heat dissipation device 4, an electrical device 6 capable of emitting thermal energy and electromagnetic interference, and a circuit board 8. A first embodiment of the electrical assembly 2, shown in FIG. 1, incorporates a first embodiment of a heat dissipation device 4 of the invention. The first embodiment of the heat dissipation device incorporates both heat dissipation features, such as a plurality of fins 34 disposed in a matrix orientation 32, and EMI reduction features, such as an EMI fence 12 grounded to the circuit.

The circuit board 8 is generally one that is used in a computing device or system (not shown), such as a personal computer or a work station. Specific examples of systems in which electrical assemblies 2 and heat dissipation devices 4 of the invention are used include the CT 410, CT 810, CT 400, and CT 800 systems, all manufactured by Sun Microsystems. The heat dissipation device 4 may also be used in conjunction with circuit boards used in other applications. The electrical device 6 is one that can emit heat and EMI. A typical electrical device 6 is a processing unit, such as a central processing unit of a personal computer. Other examples of electrical devices include memory chips used within a personal computer, or several chips within a personal computer that are used in combination.

The processing unit 6 may heat up and emit EMI. The first embodiment of the heat dissipation device 4 both transfers heat away from the electrical device 6 and reduces EMI emission from the electrical device. Other embodiments of the invention that are not shown include a heat dissipation device that includes heat dissipation features but not EMI reduction features. Yet other embodiments of the invention that are not shown include EMI reduction devices, such as an EMI fence, but not heat dissipation features.

Figure 1:
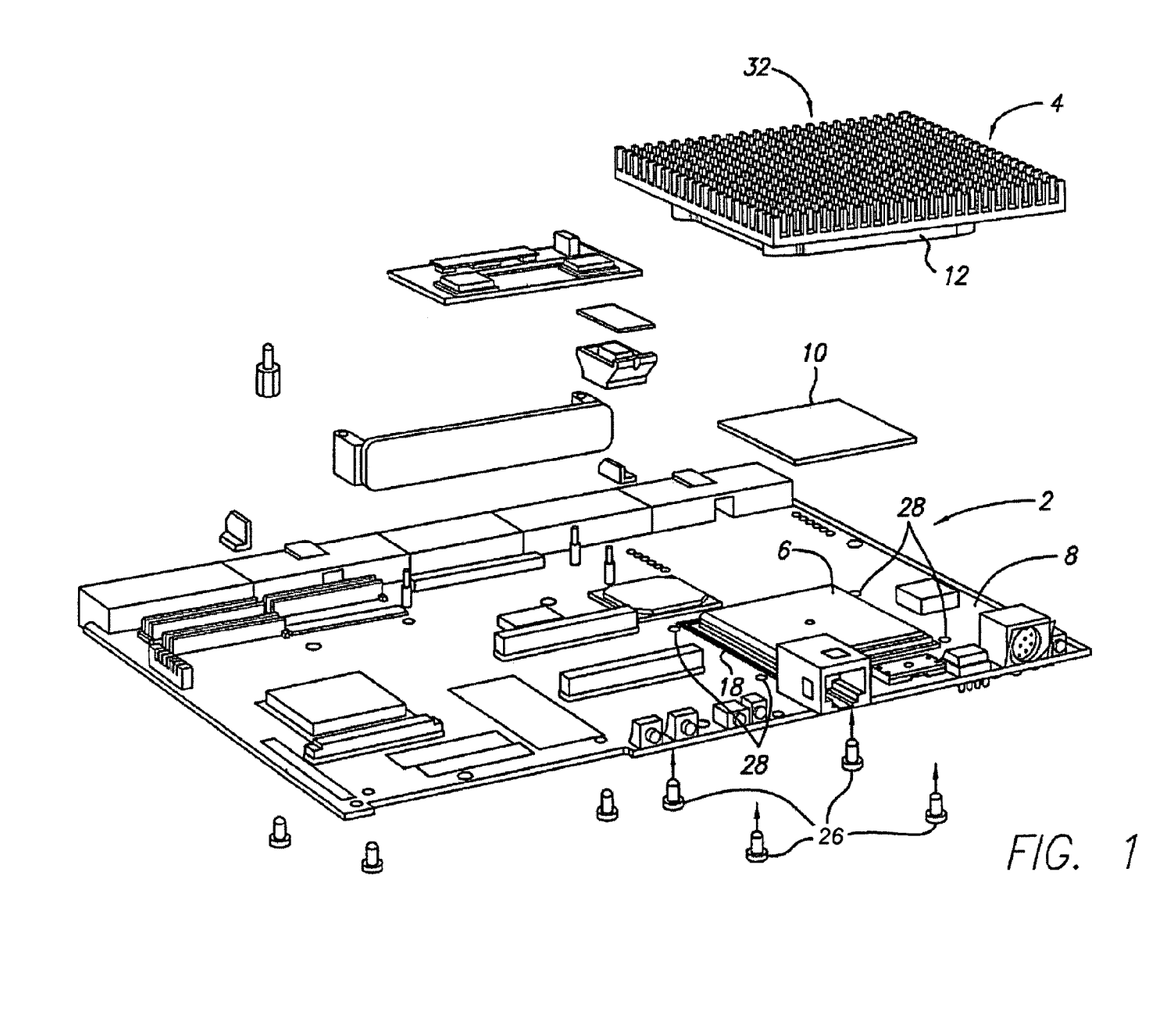
FIG. 1 is an exploded view of a first embodiment of an electrical assembly incorporating aspects of the invention.

In the first embodiment of the heat dissipation device 4, and in other embodiments that do not include EMI reduction features, the heat dissipation device is in thermal communication with the electrical device 6 to allow the transfer of heat away from the electrical device. As shown in FIG. 1, in the first embodiment of the electrical assembly 2, the heat dissipation device 4 is in thermal communication with the electrical device 6 by way of a thermal interface pad 10.

Other heat dissipation devices disadvantageously use thermal interface material that must be heated in order to change the phase of the material to a liquid form. After heating, the liquid then solidifies to provide thermal communication between thermal dissipation devices of the prior art and electrical devices. Although such material may provide efficient thermal communication, the process is expensive, and thermal interface pads that are less costly to use provide adequate thermal communication.

The thermal interface pad 10 of the first embodiment of the electrical assembly 2 is preferably compressible and expandable. Thus, the thermal interface pad 10 compresses and expands when the heat dissipation device 6 is secured to and tightened to the circuit board 8, allowing the first embodiment of the heat dissipation device to be in thermal communication with electrical devices of varying heights. One acceptable thermal interface pad 10 comprises T-Putty, series 502, which is commercially available from Thermagon, Inc. located at 4707 Detroit Ave, Cleveland, Ohio 44102. Acceptable dimensions for the thermal interface pad 10, for use with an electrical device that is about 46 mm square, are about 40 mm square and about 1.27 mm thick. Note that other thermal interface pads having different dimensions may also be used. Also note that other embodiments of the invention that include heat dissipation features may be in thermal communication with the electrical device in several manners, including not only the thermal interface pad, but also by way of the inefficient thermal interface material.

Figure 3:
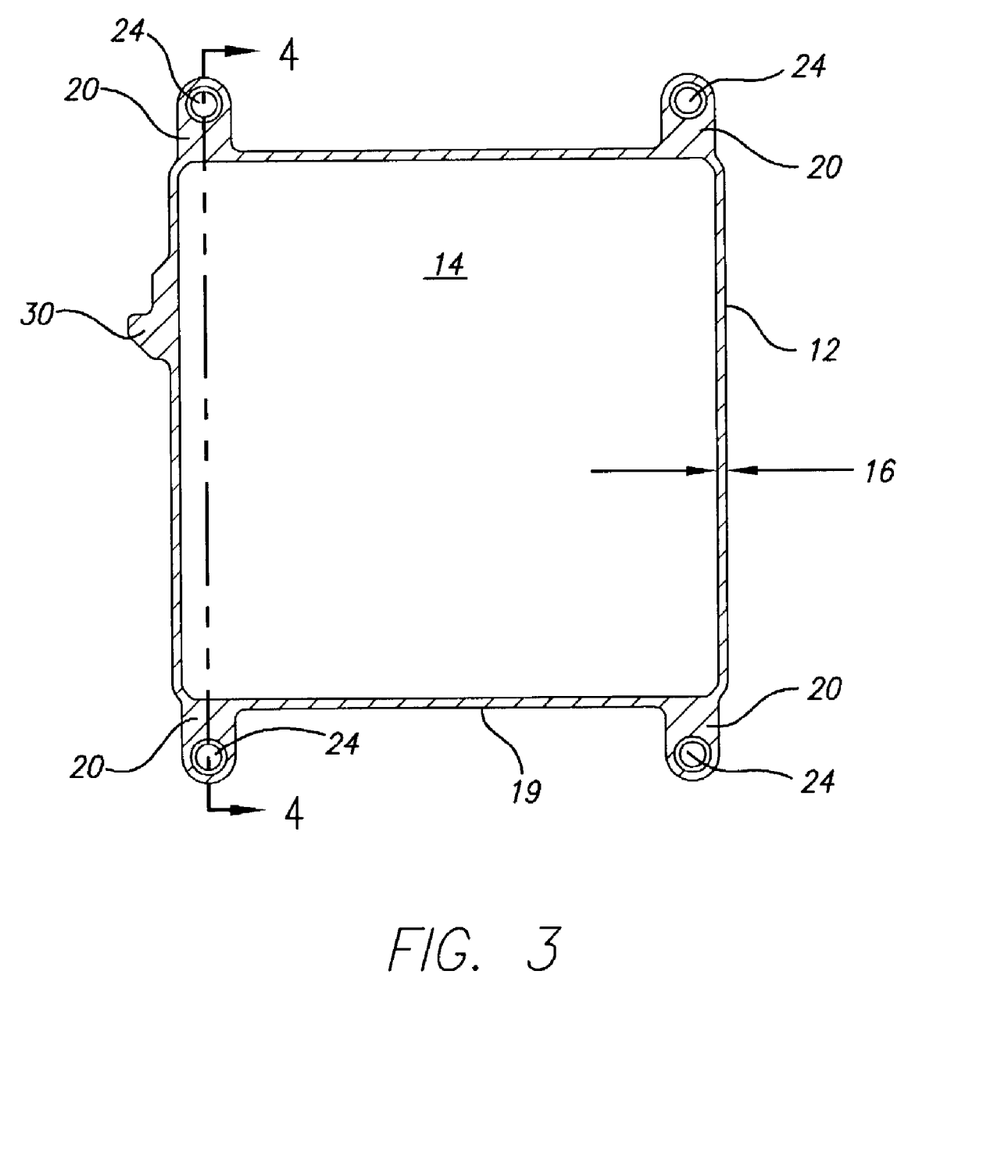
FIG. 3 is a bottom view of a first embodiment of the heat dissipation device of FIG. 2.
Figure 4:
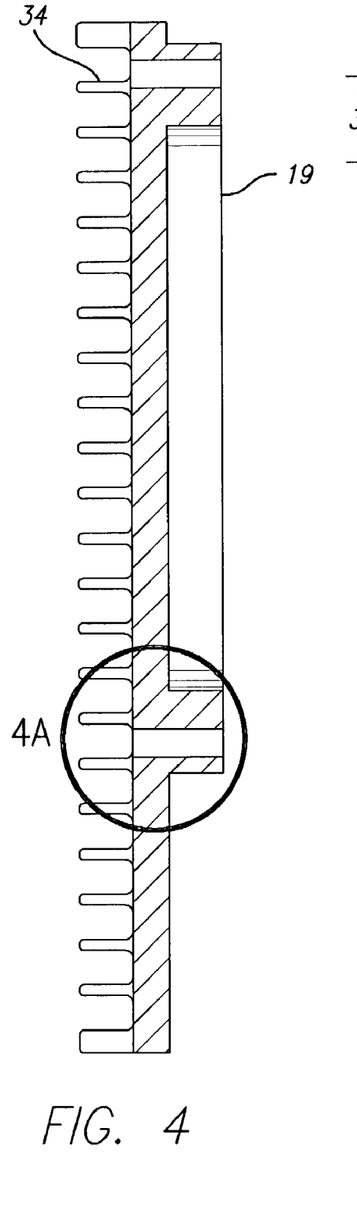
FIG. 4 is a cross sectional view of section 4—4 of the heat dissipation device of FIG. 3.

As shown in FIGS. 3 and 4, the first embodiment of the heat dissipation device 4, and other embodiments of the invention (not shown) that do not include heat dissipation features, includes an EMI fence 12. In the first embodiment, the EMI fence 12 depends from a bottom surface 14 of the heat dissipation device 4. The EMI fence 12 is configured to surround the electrical device 6 and is grounded to the circuit board 8 to reduce EMI emission from the electrical device 6 to other devices. In one embodiment, the EMI fence 12 is about 4.5 mm to about 4.9 mm in height (shown at 15 of FIG. 4a) so that the heat dissipation device 4 can accommodate electrical devices of varying heights. In another embodiment, the EMI fence 12 is about 0.8 mm thick (shown at 16 of FIG. 3) to attenuate 95% of EMI at 950 MHz.

The other embodiments include a wire mesh (not shown) that covers the electrical device and that is secured to a top surface of the EMI fence. The other embodiments are often used with memory devices because memory devices often do not require as much heat dissipation but do require EMI reduction.

For efficient EMI reduction, the EMI fence 12 should be grounded to the circuit board 8. The bottom surface 19 of the EMI fence 12 and the surface that the EMI fence is grounded to, usually a circuit board 8, are not perfectly flat and have variations, such as small bumps or indentations along the surface. Thus, measures should be taken to ensure that the EMI fence is properly grounded to the circuit board, despite the variations.

Some EMI reduction devices that use an EMI fence ground the EMI fence to the circuit board by way of a compliant member (not shown). The compliant member properly grounds the EMI fence to the circuit board, and can be made from rubber and include conductive materials within it to ensure proper grounding. However, using a compliant member in an electrical assembly for grounding purposes adds costs.

Figure 4A:
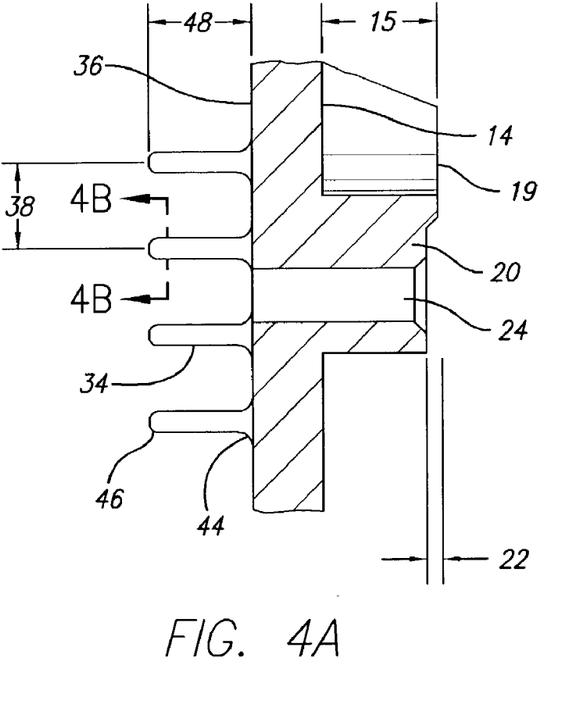
FIG. 4a is a detailed view of a portion of the heat dissipation device of FIG. 3.

In the first embodiment of the electrical assembly 2, a solder ring 18 that is substantially the shape of, and wider than the thickness 16 of, the EMI fence 12 is on the circuit board 8. The first embodiment of the heat dissipation device 4, and other embodiments of the invention that include EMI reduction features, is then placed on the circuit board 8 so that the solder ring 8 is in contact with the circuit board 8 and a bottom surface 19 of the EMI fence 12. Because of the variations discussed above and because the thickness of the solder ring 18 may vary by about 0.1 mm at locations, in an alternate embodiment, connector receiving portions 20 (described below) are desirably offset 22 from the bottom surface 14 of the EMI fence 12, as shown in FIG. 4a. The offset 22 can be from about 0.05 mm to about 0.15 mm so that the connector receiving portions 20 are higher than the circuit board 8. As a result, when the heat dissipation device 4 is first placed onto the solder ring 18, the bottom surface 19 of the EMI fence 12 contacts the solder ring first. This provides greater EMI fence 12 contact with the solder ring 18.

Without the offset 22, because of the variations in the EMI fence, circuit board, and the solder ring, the securing locations 24 (described below) may disadvantageously contact the solder ring first. The non-offset securing locations could then reduce, or in extreme cases, eliminate, contact between the EMI fence and the solder ring.

In another embodiment, a conductive paste (not shown) is added to the bottom surface 19 of the EMI fence 12 so that it also contacts the solder ring 18. The conductive paste can function with the solder ring 18 to provide for even more secure grounding of the EMI fence 12 to the circuit board 8.

As shown in FIG. 1, in the first embodiment, the heat dissipation device 4 is secured to the circuit board 8 by a plurality of connectors 26, such as screws, that are inserted through four apertures 28 formed in the circuit board 8 and received by connector receiving portions 20 formed in the EMI fence 12. The heat dissipation device 4 is thus secured to the circuit board 8 at securing locations 24 where the connectors 26 secure the heat dissipation device 4 to the circuit board 8.

In yet another embodiment of the heat dissipation device 4, when placing the heat dissipation device onto the circuit board 8, the EMI fence 12 includes a tooth 30 that can be used to determine which orientation the heat dissipation device should be placed onto the circuit board.

FIGS. 3–4 show a detailed view of the first embodiment of the heat dissipation device 4. A plurality of fins 34 disposed in a matrix orientation 32 extend from a top surface 36 of the heat dissipation device 4. The fins 34 increase heat dissipation from the electrical device 6, and transfer the heat into the air. Note that other embodiments (not shown) of the invention that do not include EMI reduction features also incorporate a plurality of fins disposed in a matrix orientation.

Other heat dissipation devices (not of the invention) incorporate a plurality of fins disposed in a matrix orientation that are spaced too close together, causing boundary layers of adjacent fins to interfere with one another. This results in ineffective heat dissipation. The first embodiment addresses this issue in the manner described below.

Figure 2:
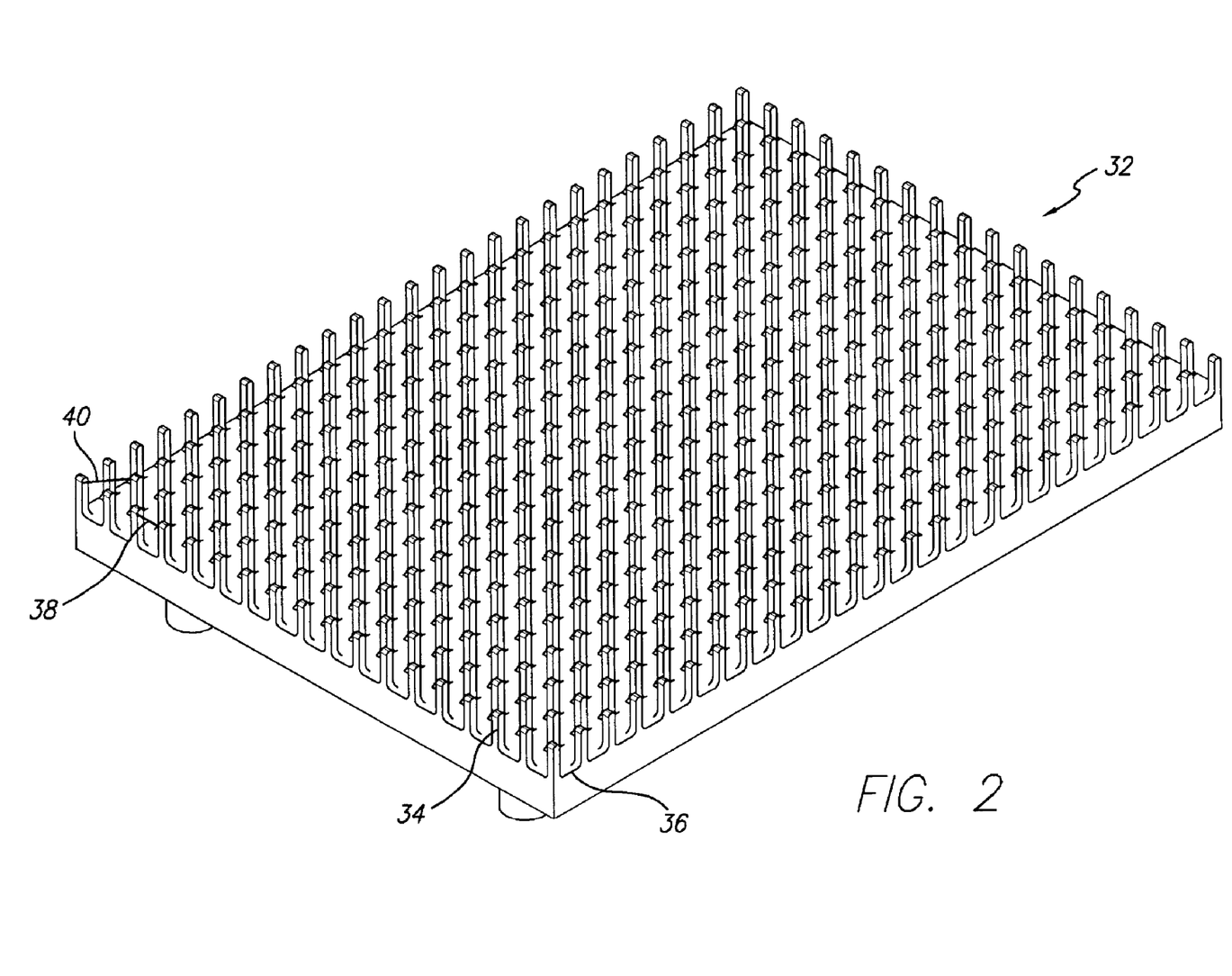
FIG. 2 is an isometric top view of a first embodiment of a heat dissipation device incorporating aspects of the invention.

Pursuant to the first embodiment, the fins 34 are spaced to allow for efficient heat dissipation. In one embodiment shown in FIG. 2, an acceptable spacing configuration is characterized by adjacent fins that are spaced about 4.1 mm (shown at 38) from one another, and fins diagonal to one another that are spaced about 5.8 mm (shown at 40). (Note that distance measurements—regarding fin spacing—are based on distances from middle portions of each fin.)

Other efficient fin spacing configurations can be deduced based on particular design requirements of the electrical device and the system in which the heat dissipation device will be used. Factors that may be taken into account in deducing fin spacing and dimensions (discussed below) include, for example, the amount of desired heat convection, which typically affects fin spacing, and desired heat conduction, which typically affects a thickness between the top 36 and bottom 14 surfaces of the heat dissipation device 4, fin height 48 (described in greater detail below), and fin thickness. The fin spacing and dimensions may be determined using, for example, Design of Experiment techniques, as taught in the fifth edition of Design & Analysis of Experiments, authored by Douglas C. Montgomary, and published by Wiley in 2001.

Figure 4B:
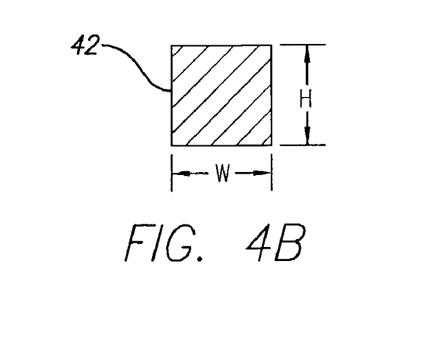
FIG. 4b is a cross sectional view of section 4b—4b of the detailed view shown in FIG. 4a; and, FIG. 5 is an isometric view of the electrical assembly of FIG. 1 shown assembled.
Figure 5:
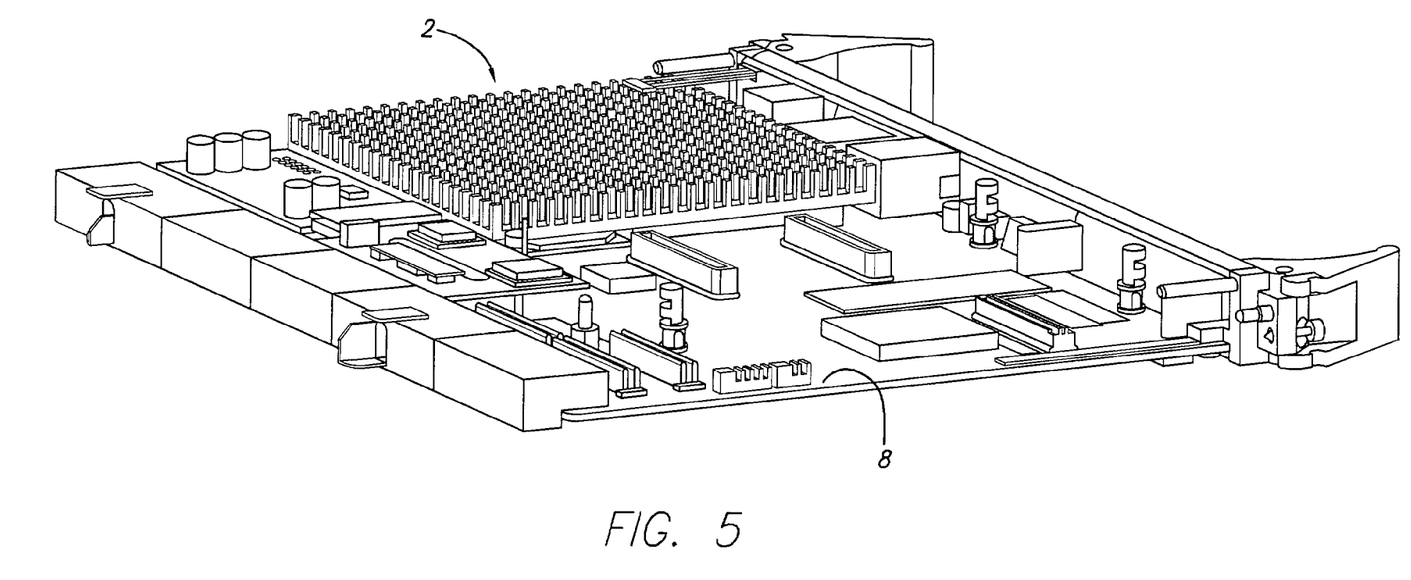

In yet another embodiment of the heat dissipation device 4, as shown in FIG. 4b, the fins 34 are characterized by a cross section that is symmetrical along two orthogonal planes, such as a substantially circular or substantially square cross-sectional shape 42. The symmetrical shape along the two orthogonal axes allows cooling in two orthogonal directions. This advantageously allows the heat dissipation device 4 to be secured to the circuit board 8 in multiple orientations, allowing the heat dissipation device 4 to be used in different systems that require the heat dissipation device to be secured in different orientations.

Other heat dissipation devices that are not symmetrical along two orthogonal planes, such as rectangular shaped fins, disadvantageously only allow heat convection in one direction, along the short side of the rectangle, but do not permit convection along the other orientation, along the long side of the rectangle.

In another embodiment, the cross sectional area of the fins are substantially uniform from a base 44 of the fin 34 to a top portion 46 of the fin 34, but that include bases 44 that have a greater cross sectional area, as shown in FIG. 4a. This provides additional strength to the fins 34, which allows the fins to better absorb forces and avoid bending stresses that the fins are often subject to during shipping and handling. Fins that taper and that have a smaller base are more susceptible to the undesirable bending effects during shipping and handling.

In the first embodiment shown, the fin height 48 (FIG. 4a) is about 5 mm to accommodate specific dimensions of the application in which heat dissipation devices 4 of the invention are used. However, those skilled in the art will recognize that the fin height 48 can be adjusted to accommodate the dimensions of other applications in which the heat dissipation device might be used.

Having thus described a preferred embodiment of the heat dissipation device, it should be apparent to those skilled in the art that certain advantages of the within system have been achieved. It should also be appreciated that various modifications, adaptations, and alternative embodiments thereof may be made within the scope and spirit of the present invention. For example, a CPU type of electrical device has been illustrated, but it should be apparent that the inventive concepts described above would be equally applicable to a memory chip type of electrical device. The invention is further defined by the following claims.

What is claimed is:

1. An electrical assembly, comprising:
   a circuit board having at least one aperture formed therein;
   an electrical device secured to the circuit board, wherein a solder ring is on the circuit board and surrounds the electrical device;
   at least one connector; and
   an electromagnetic interference (EMI) reduction device being defined by a continuous EMI fence and a cover, the cover being secured to a top surface of the EMI fence and the EMI fence being secured to the circuit board and in contact with the solder ring, wherein at least one connector receiving portion is formed within the EMI reduction device, a bottom of the connector receiving portion being slightly offset from a bottom of the EMI fence, and the at least one connector being interposed within the at least one aperture and received in the at least one connector receiving portion;
   wherein the cover of the EMI reduction device comprises a wire mesh.

2. An electrical assembly, comprising:
   a circuit board;
   an electrical device capable of emitting thermal energy secured to the circuit board; and
   a heat dissipation device secured to the circuit board in thermal communication with the electrical device, the heat dissipation device including a top surface, wherein a plurality of fins extend from the top surface;
   wherein the heat dissipation device includes a bottom surface with an electromagnetic interference (EMI) fence extending from the bottom surface, the EMI fence substantially surrounding the electrical device and being grounded to the circuit board by surface solder using a substantially continuous ring of solder, the solder being in contact with the circuit board and a bottom surface of the EMI fence.

3. The electrical assembly of claim 2, wherein the surface solder forms a continuous ring.

4. The electrical assembly of claim 2, wherein the plurality of fins are arranged in a matrix, and wherein each of the plurality of fins has a cross sectional shape that is symmetrical about two orthogonal axes.

5. The electrical assembly of claim 4, wherein the cross sectional shape of the fins is substantially square or substantially circular.

6. The electrical assembly of claim 2, wherein the fins are spaced from one another to allow for efficient heat dissipation.

7. The electrical assembly of claim 6, wherein a middle portion of the fins are spaced at least about 4 mm away from middle portions of adjacent fins, and the fins of the matrix are about 1 mm to about 2 mm in thickness and width.

8. The electrical assembly of claim 2, wherein a body portion of the fins have a substantially uniform cross-sectional area, and wherein a base of the fins have a larger cross sectional area than the body portion.

9. The electrical assembly of claim 2, wherein the electrical device is in thermal communication with the heat dissipation device by way of a thermal interface pad that is compressible.

10. The electrical assembly of claim 2, wherein the EMI fence includes a conductive paste on the bottom surface thereof, the conductive paste being in contact with the solder ring and the bottom surface of the EMI fence.

11. The electrical assembly of claim 2, further including at least one connector, wherein at least one connector receiving portion is formed within the heat dissipation device; at least one aperture is formed within the circuit board, the at least one connector being interposed within the at least one aperture and received in the at least one connector receiving portion to secure the heat dissipation device to the circuit board.

12. The electrical assembly of claim 11, wherein a bottom of the at least one connector receiving portion is slightly offset from the bottom of the EMI fence.

13. The electrical assembly of claim 2, wherein the EMI fence is less than about 1 mm thick.

14. The electrical assembly of claim 2, wherein the EMI fence is between about 4 mm to about 5 mm in height.

15. The electrical assembly of claim 2, further comprising a tooth formed along the EMI fence.

16. The electrical assembly of claim 2, further comprising:
   a thermal interface pad that is compressible;
   at least one connector;
   wherein the heat dissipation device is in thermal communication with the electrical device by way of the thermal interface pad, wherein the plurality of fins is disposed in a matrix orientation extending from the top surface;
   at least one connector receiving portion and a tooth protruding from the EMI fence,
   wherein the at least one connector receiving portion is offset from a bottom surface of the EMI fence; and
   wherein adjacent fins are spaced at least about 4 mm away from one another, each of said plurality of fins having a substantially uniform square cross sectional area;
   wherein each side of the square is about 1 mm to about 2 mm and wherein a base of the fins has a greater cross sectional area than the body of the fins,
   wherein the at least one connector is interposed within the at least one aperture and received by the at least one connector receiving portion.

17. The electrical assembly of claim 2, wherein the electrical device is a central processing unit.

* * * * *